(12) United States Patent
Casillas

(10) Patent No.: US 11,187,732 B2
(45) Date of Patent: Nov. 30, 2021

(54) VOLTAGE SENSING GLOVE ASSEMBLY

(71) Applicant: Michael Casillas, San Antonio, TX (US)

(72) Inventor: Michael Casillas, San Antonio, TX (US)

( * ) Notice: Subject to any disclaimer, the term of this patent is extended or adjusted under 35 U.S.C. 154(b) by 48 days.

(21) Appl. No.: 16/728,119

(22) Filed: Dec. 27, 2019

(65) Prior Publication Data

US 2021/0199699 A1    Jul. 1, 2021

(51) Int. Cl.
| | | |
|---|---|---|
| *G01R 19/165* | (2006.01) | |
| *A41D 19/00* | (2006.01) | |
| *G01R 19/155* | (2006.01) | |
| *G08B 5/36* | (2006.01) | |

(52) U.S. Cl.
CPC ... *G01R 19/16561* (2013.01); *A41D 19/0027* (2013.01); *G01R 19/155* (2013.01); *G08B 5/36* (2013.01)

(58) Field of Classification Search
CPC ............ G01R 19/16561; G01R 19/155; A41D 19/0027; G08B 5/36
USPC ......................................................... 324/133
See application file for complete search history.

(56) References Cited

U.S. PATENT DOCUMENTS

| | | |
|---|---|---|
| 4,441,213 A | 4/1984 | Trumble |
| 5,598,582 A | 2/1997 | Andrews |
| 5,704,066 A | 1/1998 | Yamamoto |
| 8,882,285 B2 | 11/2014 | Walsh |
| 8,945,122 B2 * | 2/2015 | Moua ..................... A61B 42/10 606/45 |
| 8,994,361 B2 | 3/2015 | Nuzzo |
| 9,872,628 B2 * | 1/2018 | Hyde .................. A61B 5/6806 |
| 9,939,468 B1 | 4/2018 | Dyszel |
| 10,247,763 B1 * | 4/2019 | Wu .................. A41D 19/01594 |
| 2009/0007313 A1 | 1/2009 | Boorsma |
| 2011/0234414 A1 | 9/2011 | ojeda |
| 2014/0028538 A1 * | 1/2014 | Shin ........................ G06F 3/017 345/156 |
| 2016/0209448 A1 | 7/2016 | Currie |
| 2017/0099888 A1 | 4/2017 | Flynn |

* cited by examiner

*Primary Examiner* — John A Tweel, Jr.

(57) ABSTRACT

A voltage sensing glove assembly includes a glove that is wearable on a user's hand. The glove is comprised of an electrically insulating material to facilitate the user to grasp exposed electrical wires without risk of electrical shock. A plurality of voltage sensors is each coupled to the glove and each of the voltage sensors is in electrical communication with the exposed electrical wires when the user grasps the exposed electrical wires. Respective ones of the voltage sensors are turned on when the voltage sensors senses electrical voltage in any of the exposed electrical wires. An alert unit is coupled to the glove and the alert unit is in electrical communication with each of the voltage sensors. The alert unit emits an alert when any of the voltage sensors is turned on to alert the user that electrical voltage has been sensed in the exposed electrical wires.

8 Claims, 7 Drawing Sheets

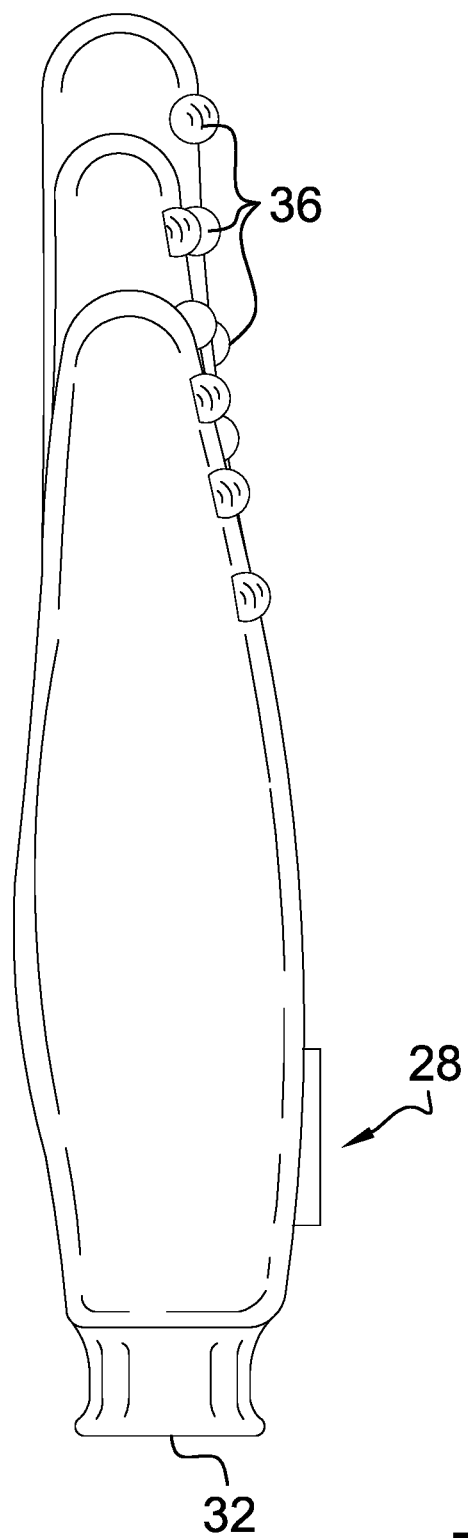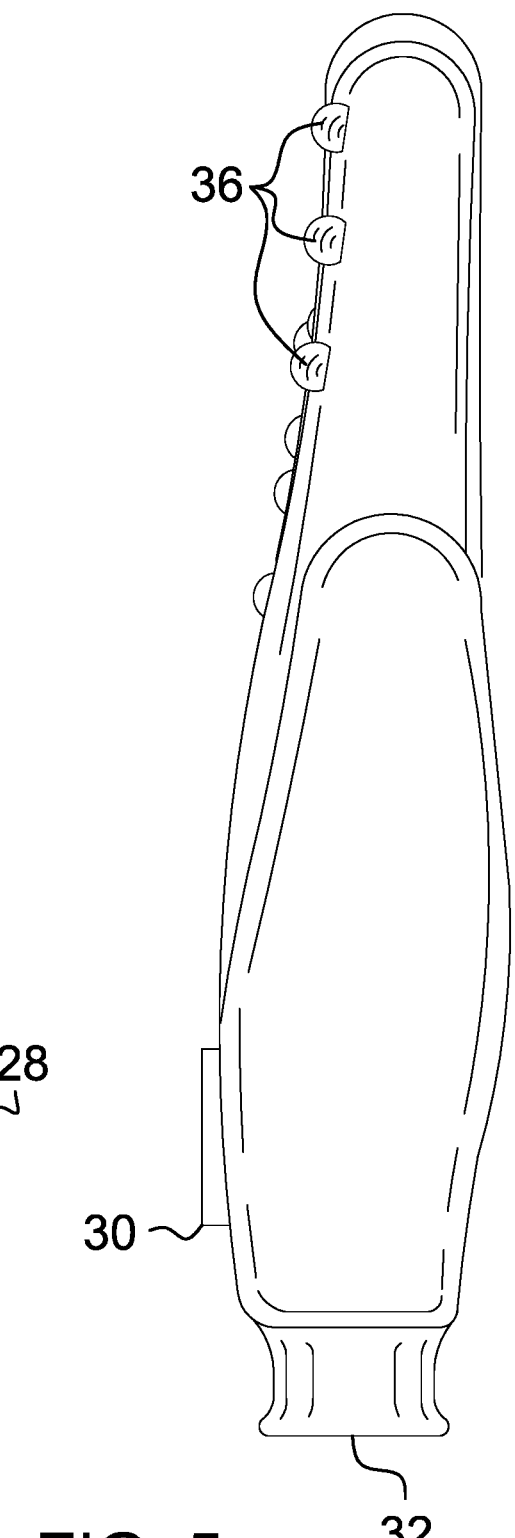

US 11,187,732 B2

VOLTAGE SENSING GLOVE ASSEMBLY

(b) CROSS-REFERENCE TO RELATED APPLICATIONS

Not Applicable

(c) STATEMENT REGARDING FEDERALLY SPONSORED RESEARCH OR DEVELOPMENT

Not Applicable

(d) THE NAMES OF THE PARTIES TO A JOINT RESEARCH AGREEMENT

Not Applicable

(e) INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

(f) STATEMENT REGARDING PRIOR DISCLOSURES BY THE INVENTOR OR JOINT INVENTOR

Not Applicable

(g) BACKGROUND OF THE INVENTION

(1) Field of the Invention

The disclosure relates to sensing devices and more particularly pertains to a new sensing device for sensing electrical voltage in electrical wires without contacting the electrical wires.

(2) Description of Related Art Including Information Disclosed Under 37 CFR 1.97 and 1.98

The prior art relates to sensing devices. The prior art discloses a variety of gloves that are not only comprised of a plurality of layers, but also include electrical insulation properties. The prior art also discloses a glove with thermal insulation properties and an electrical safety glove that has raised portions aligned with knuckles on a user's hand. The prior art discloses a glove that has electrical sensing portions integrated therein which illuminate when exposed to an electromagnetic field. Additionally, the prior art discloses a voltage sensor that is worn on a user's finger in the convention of a ring. The prior art discloses a glove with a non contact voltage sensor being integrated throughout the glove for detecting electrical voltage. The prior art discloses a glove that has a single, non contact voltage sensor being coupled thereto for sensing electrical voltage.

(h) BRIEF SUMMARY OF THE INVENTION

An embodiment of the disclosure meets the needs presented above by generally comprising a glove that is wearable on a user's hand. The user may be an electrician or other worker that is working with electrical wires that could potentially be carrying voltage. The glove is comprised of an electrically insulating material to facilitate the user to grasp exposed electrical wires without risk of electrical shock. A plurality of voltage sensors is each coupled to the glove and each of the voltage sensors is in electrical communication with the exposed electrical wires when the user grasps the exposed electrical wires. Respective ones of the voltage sensors are turned on when the voltage sensors senses electrical voltage in any of the exposed electrical wires. An alert unit is coupled to the glove and the alert unit is in electrical communication with each of the voltage sensors. The alert unit emits an alert when any of the voltage sensors is turned on to alert the user that electrical voltage has been sensed in the exposed electrical wires.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

(i) BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein:

FIG. 4 is a left side view of an embodiment of the disclosure.

FIG. 5 is a right side view of an embodiment of the disclosure.

(j) DETAILED DESCRIPTION OF THE INVENTION

Figure 1:
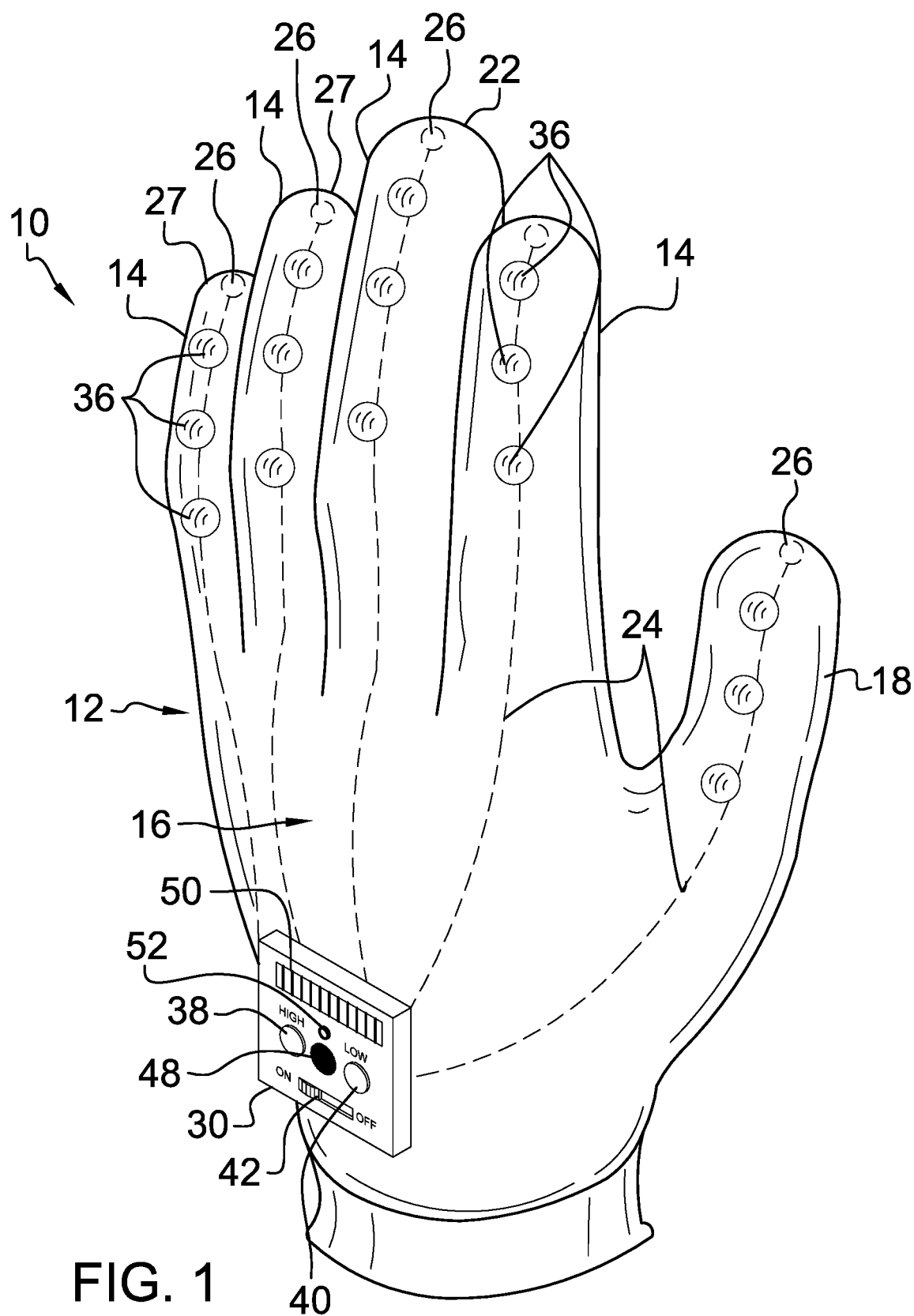
FIG. 1 is a perspective view of voltage sensing glove assembly according to an embodiment of the disclosure.
Figure 2:
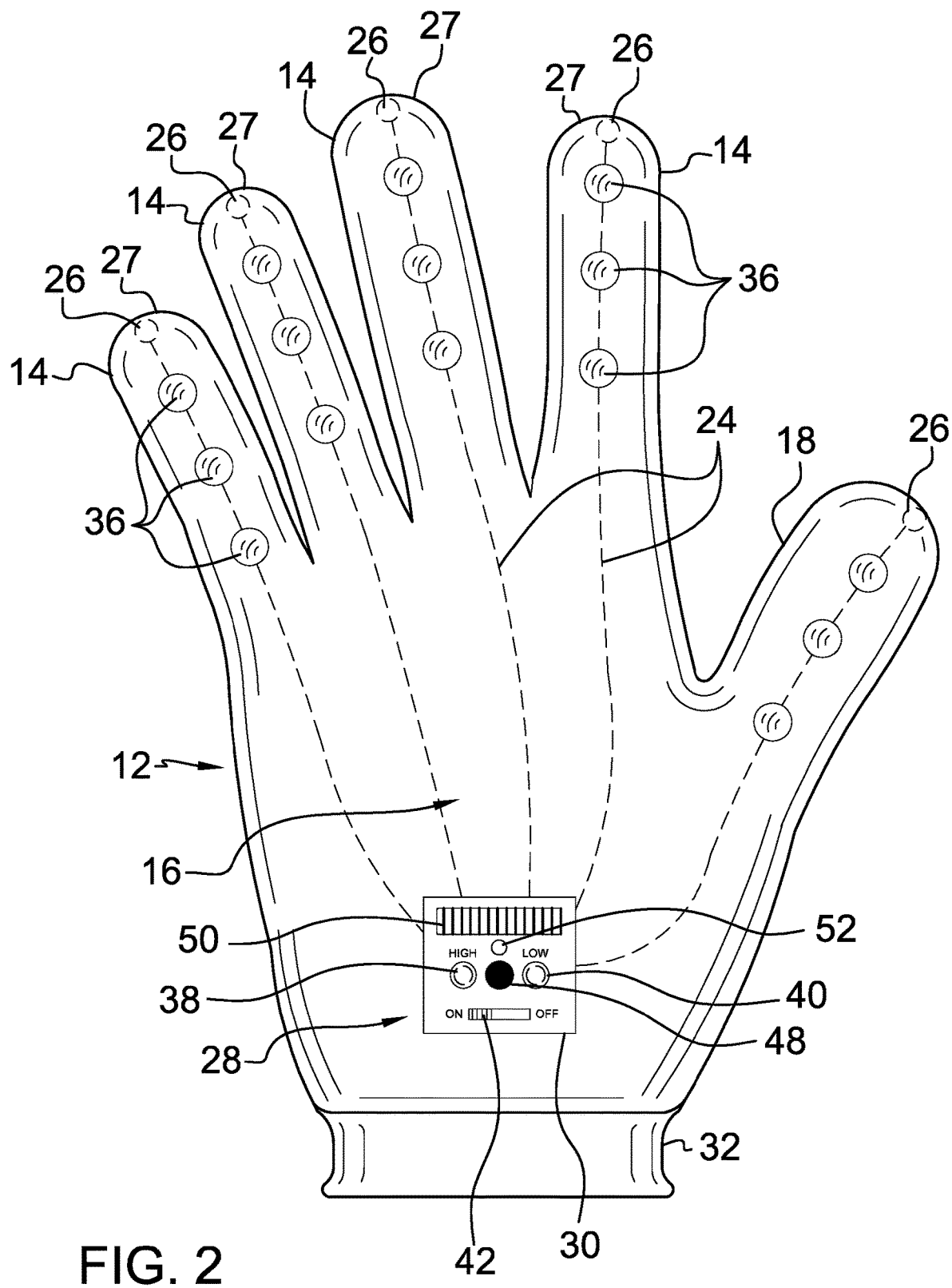
FIG. 2 is a bottom phantom view of an embodiment of the disclosure.
Figure 3:
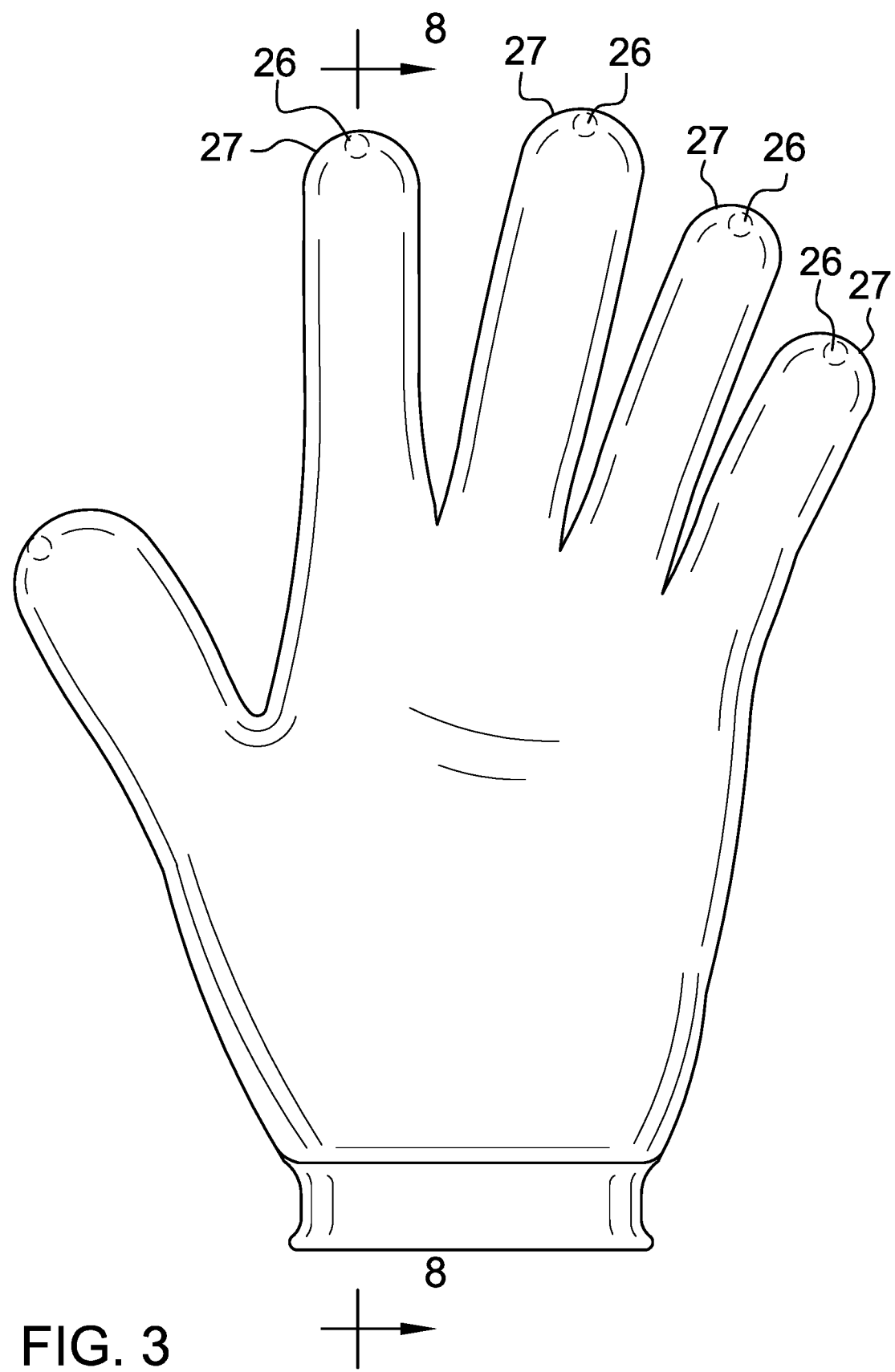
FIG. 3 is a top view of an embodiment of the disclosure.
Figure 6:
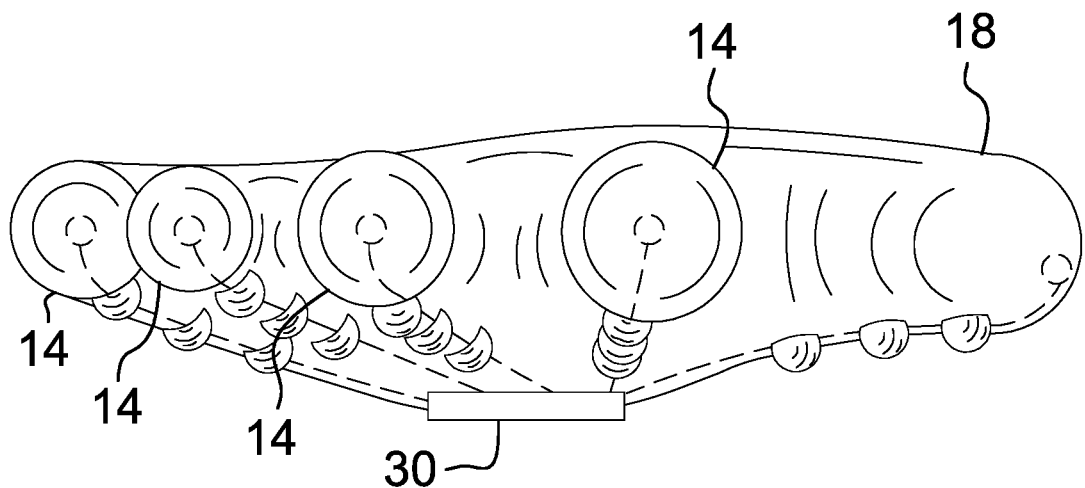
FIG. 6 is a front view of an embodiment of the disclosure.
Figure 7:
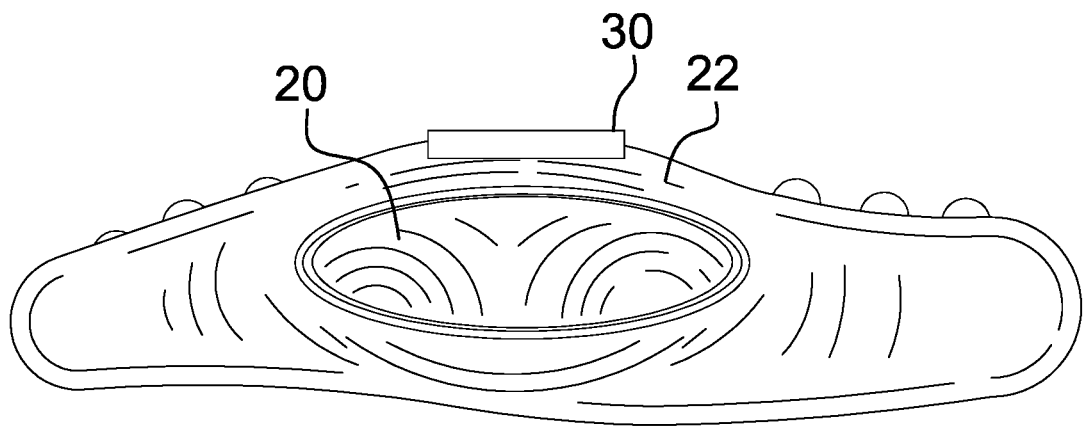
FIG. 7 is a back view of an embodiment of the disclosure.
Figure 8:
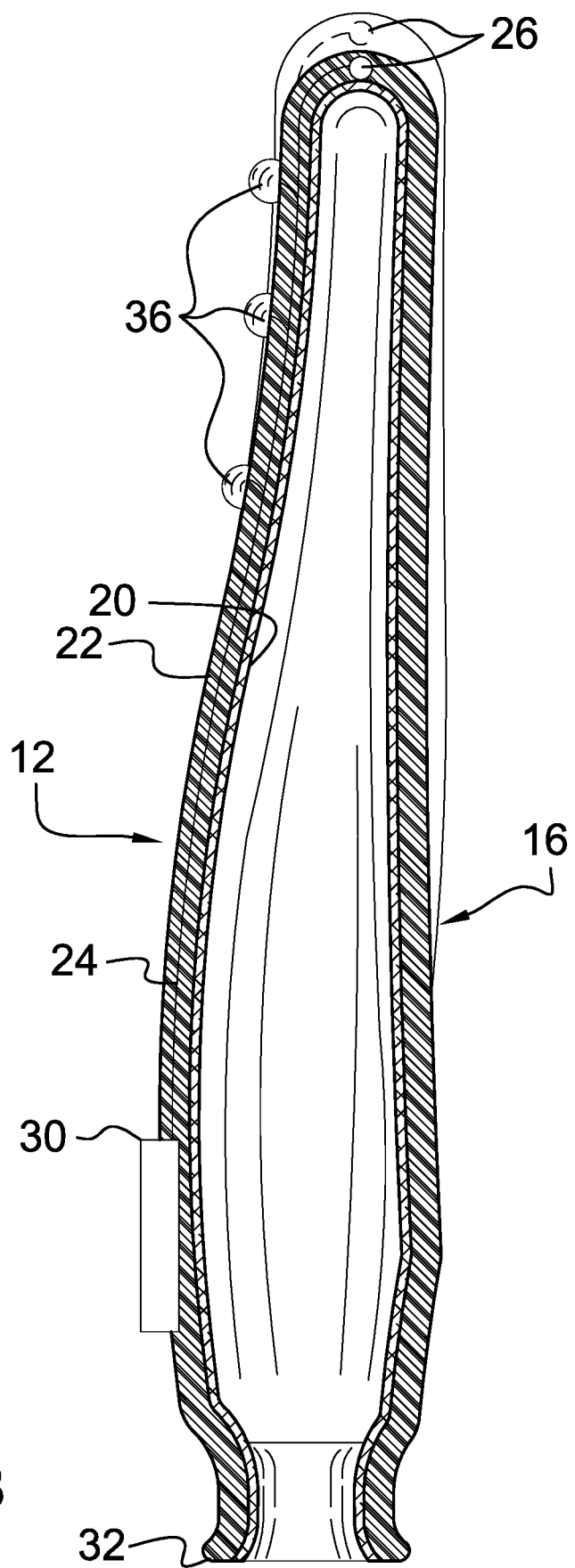
FIG. 8 is a cross sectional view taken along line 8-8 of FIG. 3 of an embodiment of the disclosure.
Figure 9:
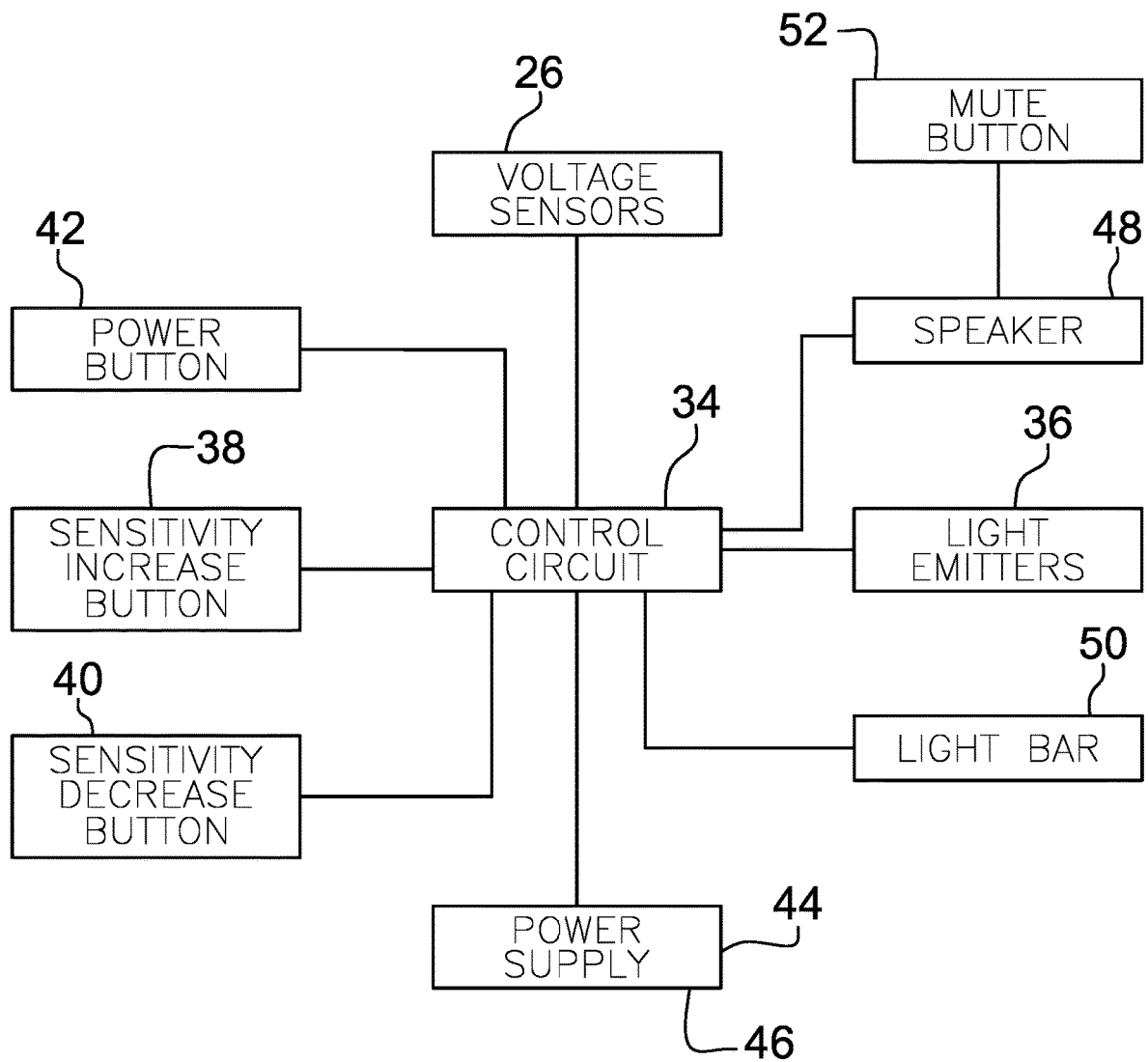
FIG. 9 is a schematic view of an embodiment of the disclosure.

With reference now to the drawings, and in particular to FIGS. 1 through 9 thereof, a new sensing device embodying the principles and concepts of an embodiment of the disclosure and generally designated by the reference numeral 10 will be described.

As best illustrated in FIGS. 1 through 9, the voltage sensing glove assembly 10 generally comprises a glove 12 that is wearable on a user's hand. The glove 12 is comprised of an electrically insulating material to facilitate the user to grasp exposed electrical wires without risk of electrical shock. The glove 12 has a plurality of fingers 14, a hand portion 16 and a thumb 18. The glove 12 comprises an inner layer 20 and an outer layer 22; the outer layer 22 is comprised of an electrically insulating material and the inner layer 20 is comprised of a textile material for enhancing comfort for the user. The outer layer 22 may comprise rubber or other suitably flexible material that allows the glove 12 to deform.

An array of conductors 24 is integrated into the outer layer 22 of the glove 12. The array of conductors 24 radiates outwardly from the hand portion 16 into each of the fingers 14 and the thumb 18. A plurality of voltage sensors 26 is provided and each of the voltage sensors 26 is coupled to the glove 12. Each of the voltage sensors 26 is in electrical communication with the exposed electrical wires when the user grasps the exposed electrical wires. Moreover, respective ones of the voltage sensors 26 are turned on when the respective voltage sensors 26 senses electrical voltage in any of the exposed electrical wires. Each of the plurality of voltage sensors 26 is positioned on a distal end 27 of a respective one of the fingers 14 and the thumb 18. Additionally, each of the voltage sensors 26 is electrically coupled to a respective one of the array of conductors 24 and each of the voltage sensors 26 is embedded in the outer layer 22 of the glove 12. Each of the voltage sensors 26 may comprise a non contact voltage sensor that employs capacitive coupling to sense changes in the electromagnetic field of the exposed electrical wire that is carrying voltage.

An alert unit 28 is coupled to the glove 12 and the alert unit 28 is in electrical communication with each of the voltage sensors 26. The alert unit 28 emits an alert when any of the voltage sensors 26 is turned on. In this way the alert unit 28 can alert the user that electrical voltage has been sensed in the exposed electrical wires. The alert unit 28 comprises a housing 30 that is coupled to the outer layer 22 of the glove 12. The housing 30 may be positioned adjacent to a cuff 32 of the glove 12 and the housing 30 is positioned on top of the user's hand when the user wears the glove 12.

A control circuit 34 is positioned in the housing 30 and each of the array of conductors 24 is electrically coupled to the control circuit 34. The control circuit 34 receives an alert input when any of the voltage sensors 26 is turned on. A plurality of light emitters 36 is each coupled to the glove 12 and each of the light emitters 36 emits a visual alert outwardly therefrom. Each of the light emitters 36 is electrically coupled to the control circuit 34 and each of the light emitters 36 emits a first color of light or a second color of light.

Each of the light emitters 36 emits the first color of light when the control circuit 34 does not receive the alert input. In this way the light emitters 36 communicate an absence of voltage to the user. Each of the light emitters 36 emits the second color of light when the control circuit 34 receives the alert input. In this way the light emitters 36 alert the user that electrical voltage has been sensed in the exposed electrical wires. Each of the light emitters 36 is positioned on a respective one of the fingers 14 and the thumb 18 and each of the light emitters 36 is associated with a respective one of the voltage sensors 26. Additionally, the light emitters 36 that are associated with the respective voltage sensor 26 emit the second color of light when the respective voltage sensor 26 is turned on. In this way the light emitters 36 on each of the fingers 14 and the thumb 18 facilitate the user to accurately determine the location of the exposed electrical wire that is carrying voltage.

A sensitivity increase button 38 is movably coupled to the housing 30 and the sensitivity increase button 38 is electrically coupled to the control circuit 34. The sensitivity increase button 38 increases sensitivity of the plurality of voltage sensors 26 when the sensitivity increase button 38 is depressed. A sensitivity decrease button 40 is movably coupled to the housing 30 and the sensitivity decrease button 40 is electrically coupled to the control circuit 34. The sensitivity decrease button 40 decreases sensitivity of the plurality of voltage sensors 26 when the sensitivity decrease button 40 is depressed.

A power button 42 is movably coupled to the housing 30 and the power button 42 is electrically coupled to the control circuit 34. The power button 42 turns the control circuit 34 on and off. A power supply 44 is positioned in the housing 30, the power supply 44 is electrically coupled to the control circuit 34 and the power supply 44 comprises at least one battery 46.

A speaker 48 is coupled to the housing 30 and the speaker 30 is electrically coupled to the control circuit 34. The speaker 48 emits an audible alarm when the control circuit 34 receives the alert input for audibly alerting the user. A light bar 50 is positioned on the housing 30 and the light bar 50 is electrically coupled to the control circuit 34. A portion of the light bar 50 is illuminated when the control circuit 34 receives the alert input resulting from a low voltage source. Moreover, the entirety of the light bar 50 is illuminated when the control circuit 34 receives the alert input resulting from a high voltage source. In this way the light bar 50 facilitates the user to differentiate between low voltage and high voltage. A mute button 52 is coupled to the housing 30, the mute button 52 is electrically coupled to the speaker 48 and the mute button 52 mutes the speaker 48 when the mute button 52 is depressed.

In use, the user wears the glove 12 when the user needs to determine if exposed electrical wires are carrying voltage. The power button 42 is turned on and each of the light emitters 36 emits the first color of light. Any of the voltage sensors 26 that sense voltage is turned on when the user places the glove 12 near the exposed electrical wires. Thus, the light emitters 36 that are associated with the voltage sensor 26 that is turned on begin emitting the second color of light. In this way the user is alerted that voltage has been sensed in the exposed electrical wires. In this way the user can perform electrical troubleshooting procedures without being exposed to the risk of electrical shock. Additionally, the speaker 48 emits the audible tone and the light bar 50 illuminates when the voltage sensors 26 sense voltage.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A voltage sensing glove assembly being configured to be worn on an electrical worker for identifying wires carrying electrical voltage, said assembly comprising:
   a glove being wearable on a user's hand, said glove being comprised of an electrically insulating material wherein said glove is configured to facilitate the user to grasp exposed electrical wires without risk of electrical shock, said glove having a plurality of fingers, a hand portion and a thumb, said glove comprising an inner layer and an outer layer, said outer layer being comprised of an electrically insulating material, said inner layer being comprised of a textile material for enhancing comfort for the user;
   a plurality of voltage sensors, each of said voltage sensors being coupled to said glove wherein each of said voltage sensors is configured to be in electrical communication with the exposed electrical wires when the user grasps the exposed electrical wires, respective ones of said voltage sensors being turned on when said respective voltage sensors senses electrical voltage in any of the exposed electrical wires;
   an alert unit being coupled to said glove, said alert unit being in electrical communication with each of said voltage sensors, said alert unit emitting an alert when any of said voltage sensors is turned on wherein said alert unit is configured to alert the user that electrical voltage has been sensed in the exposed electrical wires;
   an array of conductors, said array of conductors being integrated into said outer layer of said glove, said array of conductors radiating outwardly from said hand portion into each of said fingers and said thumb;
   wherein said alert unit comprises
      a housing being coupled to said exposed surface of said outer layer of said glove, and
      a control circuit being positioned in said housing, said control circuit having each of said array of conductors being electrically coupled thereto, said control circuit receiving an alert input when any of said voltage sensors is turned on, and
      a plurality of light emitters, each of said light emitters being coupled to said glove wherein each of said light emitters is configured to emit a visual alert outwardly therefrom, each of said light emitters being electrically coupled to said control circuit, each of said light emitters emitting a first color of light or a second color of light; and
   a sensitivity increase button being movably coupled to said housing, said sensitivity increase button being electrically coupled to said control circuit, said sensitivity increase button increasing sensitivity of said plurality of voltage sensors when said sensitivity increase button is depressed.

2. The assembly according to claim 1, wherein each of said plurality of voltage sensors is positioned on a distal end of a respective one of said fingers and said thumb, each of said voltage sensors being electrically coupled to a respective one of said array of conductors, each of said voltage sensors being embedded in said outer layer of said glove.

3. The assembly according to claim 1, wherein:
   each of said light emitters emits said first color of light when said control circuit does not receive said alert input wherein each of said light emitters is configured to communicate an absence of voltage to the user; and
   each of said light emitters emits said second color of light when said control circuit receives said alert input wherein said plurality of light emitters is configured to alert the user that electrical voltage has been sensed in the exposed electrical wires.

4. The assembly according to claim 3, wherein each of said light emitters is positioned on a respective one of said fingers and said thumb, each of said light emitters being associated with a respective one of said voltage sensors.

5. The assembly according to claim 1, further comprising a sensitivity decrease button being movably coupled to said housing, said sensitivity decrease button being electrically coupled to said control circuit, said sensitivity decrease button decreasing sensitivity of said plurality of voltage sensors when said sensitivity decrease button is depressed.

6. The assembly according to claim 5, further comprising a power button being movably coupled to said housing, said power button being electrically coupled to said control circuit, said power button turning said control circuit on and off.

7. The assembly according to claim 6, further comprising a power supply being positioned in said housing, said power supply being electrically coupled to said control circuit, said power supply comprising at least one battery.

8. A voltage sensing glove assembly being configured to be worn on an electrical worker for identifying wires carrying electrical voltage, said assembly comprising:
   a glove being wearable on a user's hand, said glove being comprised of an electrically insulating material wherein said glove is configured to facilitate the user to grasp exposed electrical wires without risk of electrical shock, said glove having a plurality of fingers, a hand portion and a thumb, said glove comprising an inner layer and an outer layer, said outer layer being comprised of an electrically insulating material, said inner layer being comprised of a textile material for enhancing comfort for the user;
   an array of conductors, said array of conductors being integrated into said outer layer of said glove, said array of conductors radiating outwardly from said hand portion into each of said fingers and said thumb;
   a plurality of voltage sensors, each of said voltage sensors being coupled to said glove wherein each of said voltage sensors is configured to be in electrical communication with the exposed electrical wires when the user grasps the exposed electrical wires, respective ones of said voltage sensors being turned on when said respective voltage sensors senses electrical voltage in any of the exposed electrical wires, each of said plurality of voltage sensors is positioned on a distal end of a respective one of said fingers and said thumb, each of said voltage sensors being electrically coupled to a respective one of said array of conductors, each of said voltage sensors being embedded in said outer layer of said glove;
   an alert unit being coupled to said glove, said alert unit being in electrical communication with each of said voltage sensors, said alert unit emitting an alert when any of said voltage sensors is turned on wherein said alert unit is configured to alert the user that electrical voltage has been sensed in the exposed electrical wires, said alert unit comprising:
      a housing being coupled to said exposed surface of said outer layer of said glove;
      a control circuit being positioned in said housing, said control circuit having each of said array of conductors being electrically coupled thereto, said control circuit receiving an alert input when any of said voltage sensors is turned on;

a plurality of light emitters, each of said light emitters being coupled to said glove wherein each of said light emitters is configured to emit a visual alert outwardly therefrom, each of said light emitters being electrically coupled to said control circuit, each of said light emitters emitting a first color of light or a second color of light, each of said light emitters emitting said first color of light when said control circuit does not receive said alert input wherein each of said light emitters is configured to communicate an absence of voltage to the user, each of said light emitters emitting said second color of light when said control circuit receives said alert input, wherein said light emitter is configured to alert the user that electrical voltage has been sensed in the exposed electrical wires, each of said light emitters being positioned on a respective one of said fingers and said thumb, each of said light emitters being associated with a respective one of said voltage sensors;

a sensitivity increase button being movably coupled to said housing, said sensitivity increase button being electrically coupled to said control circuit, said sensitivity increase button increasing sensitivity of said plurality of voltage sensors when said sensitivity increase button is depressed;

a sensitivity decrease button being movably coupled to said housing, said sensitivity decrease button being electrically coupled to said control circuit, said sensitivity decrease button decreasing sensitivity of said plurality of voltage sensors when said sensitivity decrease button is depressed;

a power button being movably coupled to said housing, said power button being electrically coupled to said control circuit, said power button turning said control circuit on and off; and a power supply being positioned in said housing, said power supply being electrically coupled to said control circuit, said power supply comprising at least one battery.

\* \* \* \* \*